US 6,638,805 B2

(12) United States Patent
Park et al.

(10) Patent No.: US 6,638,805 B2
(45) Date of Patent: Oct. 28, 2003

(54) METHOD OF FABRICATING A DRAM SEMICONDUCTOR DEVICE

(75) Inventors: Byung-jun Park, Suwon (KR); Yoo-sang Hwang, Yongin (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/146,893

(22) Filed: May 17, 2002

(65) Prior Publication Data

US 2003/0027395 A1 Feb. 6, 2003

(30) Foreign Application Priority Data

Aug. 3, 2001  (KR) ............................ 01-46974

(51) Int. Cl.[7] ................. H01L 21/3205; H01L 21/4763
(52) U.S. Cl. ...................... 438/233; 438/303; 438/637; 438/639; 438/675
(58) Field of Search ................. 438/229, 233, 438/299, 303, 592, 597, 598, 618, 620, 622, 637–640, 672, 674, 675

(56) References Cited

U.S. PATENT DOCUMENTS

| 5,296,400 | A | * | 3/1994 | Park et al. ............ 438/597 |
| 5,965,035 | A | * | 10/1999 | Hung et al. ........... 438/740 |
| 6,010,935 | A | * | 1/2000 | Doan .................. 438/303 |
| 6,043,116 | A | * | 3/2000 | Kuo ................... 438/233 |
| 6,077,763 | A | * | 6/2000 | Chen et al. ........... 438/595 |
| 6,133,096 | A | * | 10/2000 | Su et al. ............. 438/303 |
| 6,297,105 | B1 | * | 10/2001 | Guo .................. 438/299 |
| 6,486,016 | B2 | * | 11/2002 | Kim et al. ............ 438/233 |

FOREIGN PATENT DOCUMENTS

| JP | 11-284186 | * | 10/1999 | ........ H01L/29/78 |
| JP | 2001-196549 | * | 7/2001 | ........ H01L/27/10 |

* cited by examiner

*Primary Examiner*—Wael Fahmy
*Assistant Examiner*—Anh Duy Mai
(74) *Attorney, Agent, or Firm*—Lee & Sterba, P.C.

(57) ABSTRACT

A method of fabricating a DRAM semiconductor device including forming gate stacks in which a gate pattern and a gate sacrificial mask are sequentially deposited on a semiconductor substrate, forming an etch stopper on the semiconductor substrate, forming a lightly doped impurity region between the gate stacks, forming a gate spacer along sidewalls of the gate stacks, forming a heavily doped impurity region to contact the lightly doped impurity region and to be aligned with the gate spacer, removing the gate spacer, forming an interlevel dielectric layer to fill a gap between the gate stacks, forming a groove on a gate conductive layer by etching an exposed top surface of the etch stopper and the gate sacrificial mask, forming a contact mask pattern for filling the groove, forming a contact hole to be self-aligned with respect to the contact mask pattern, and forming a contact pad in the contact hole.

29 Claims, 8 Drawing Sheets

METHOD OF FABRICATING A DRAM SEMICONDUCTOR DEVICE

BACKGROUND OF THE INVENTION

1. Field of the Invention

The present invention relates to a method of fabricating a semiconductor memory device. More particularly, the present invention relates to a method of fabricating a dynamic random access memory (DRAM) semiconductor device.

2. Description of the Related Art

Generally, decreasing a design rule results in a reduction in the gate length of a DRAM semiconductor device. In order to maintain a threshold voltage in a cell transistor having a shortened gate length, the amount of channel stop impurities to be implanted in a semiconductor substrate must be increased. However, increasing the channel stop impurity dose may cause ion implantation damage resulting in increased current leakage. Furthermore, reducing the gate length causes short channel effects.

Conventionally, these problems have been addressed by forming a source/drain region having a lightly doped drain (LDD) structure and by forming a contact hole by a self-aligned contact (SAC) method. To explain these procedures more fully, a conventional method of fabricating a DRAM semiconductor device adopting the LDD structure and the SAC method will now be described with reference to FIGS. 1 through 4.

FIGS. 1 through 3 illustrate cross-sectional views of steps in a conventional method of fabricating a DRAM semiconductor device. FIG. 4 shows a cell region layout of the conventional DRAM semiconductor device shown in FIG. 3. Like reference numerals in FIGS. 1 through 4 represent like elements.

Referring to FIG. 1, a shallow trench isolation (STI) region 11 is formed on a semiconductor substrate 10, which divides the semiconductor substrate 10 into two portions, i.e., a non-active region, in which the STI region 11 is formed, and an active region. The semiconductor substrate 10 will be later defined by a cell region (CA), in which a memory cell is formed, and a core/peripheral circuit region (PA).

Subsequently, channel stop impurities are ion-implanted into the entire semiconductor substrate 10 having the STI region 11 to control a threshold voltage of a transistor. If the semiconductor substrate 10 is a p-type silicon substrate, boron is used as the channel stop impurity.

Then, a gate stack 18 is formed on the semiconductor substrate 10 having the STI region 11. The gate stack 18 includes a gate insulating layer 12, a gate conductive layer 14 and a capping layer 16. The gate insulating layer 12, the gate conductive layer 14 and the capping layer 16 are formed from a silicon oxidation layer, a double layer of a polysilicon layer and a metal silicide layer, and a silicon nitride layer, respectively.

Next, the semiconductor substrate 10 is lightly doped with impurities to form a first impurity region 20 around the gate stack 18. A gate spacer 22 is formed from a silicon nitride layer along sidewalls of the gate stack 18. Then, the semiconductor substrate 10 is more heavily doped with impurities than the first impurity region 20 to form a second impurity region 24 between the gate spacers 22. A source/drain region having a lightly doped drain (LDD) structure results from the doping concentrations of the first and second impurity regions 20 and 24.

Thereafter, an interlevel dielectric layer 26 is formed of a silicon oxide layer on the entire semiconductor substrate 10 to fill gaps between the gate spacers 22. Then, a self-aligned contact pattern 28 is formed on the interlevel dielectric layer 26 using photoresist.

Referring to FIG. 2, the interlevel dielectric layer 26 is self-aligned contact etched to be aligned with respect to the gate spacers 22 using the self-aligned contact pattern 28 as an etching mask, thereby forming a contact hole 30 for exposing the second impurity region 24. When the interlevel dielectric layer 26 is self-aligned contact etched, the interlevel dielectric layer 26, made of the silicon oxide layer, has a higher etching selectivity than the gate spacer 22, made of a silicon nitride layer. Accordingly, the contact hole 30 may be formed to be aligned with respect to the gate spacer 22.

Referring to FIG. 3, the self-aligned contact pattern 28 is removed. Next, a conductive layer (not shown as an independent layer) for a contact pad is formed on the entire semiconductor substrate 10 to completely fill the contact hole 30. Then, the resultant structure is etched by chemical-mechanical polishing (CMP) using the surface of the interlevel dielectric layer 26 as an etch stopping point, i.e., the CMP is performed until the surface of the interlevel dielectric layer 26 is exposed, thus forming contact pads 32a through 32c. Here, contact pad 32b is a direct contact (DC) pad, later to be connected with a bit line, and contact pads 32a and 32c are buried contact (BC) pads, later to be connected to a storage electrode.

In a conventional method of fabricating a DRAM semiconductor device adopting the LDD structure and the self-aligned contact (SAC) method, the width of the gaps between the gate stacks 18 is narrowed by gate spacers 22 formed from a silicon nitride layer. Accordingly, when the interlevel dielectric layer 26 shown in FIG. 1 is formed, a void may occur in the region between the gate stacks 18. Reference character X in FIG. 4 indicates the portion wherein a void occurs. Subsequent to the occurrence of a void in the interlevel dielectric layer 26, a conductive layer for forming a contact pad is formed over the X portion, thereby causing a bridge between the contact pads 32. For this reason, it is impossible to use the SAC method when forming contact hole 30. Further, it is difficult to maintain a constant threshold voltage of a cell transistor in a conventional DRAM semiconductor device having an LDD structure without increasing the dose of the channel stop impurities.

SUMMARY OF THE INVENTION

It is a feature of an embodiment of the present invention to provide a method of fabricating a DRAM semiconductor device having an LDD structure for maintaining a threshold voltage, and in which the SAC method may be used, while reducing or minimizing an increase in a channel stop impurity dose.

To provide this and other features of the present invention, there is provided a method of fabricating a DRAM semiconductor device as a first embodiment of the present invention. In the method of the first embodiment of the present invention, gate stacks, in which a gate pattern and a gate sacrificial mask are sequentially deposited, are formed on a semiconductor substrate defined by a non-active region and an active region. The gate sacrificial mask may be formed from a silicon nitride layer. Then, an etch stopper is formed on the entire semiconductor substrate to surround the gate stacks. The etch stopper may also be formed of a silicon nitride layer.

Next, a lightly doped impurity region is formed between the gate stacks on the semiconductor substrate. The lightly doped impurity region is an N– impurity region when the semiconductor substrate is a p-type silicon substrate. Thereafter, a gate spacer is formed along sidewalls of the gate stacks. The gate spacer may also be formed from a silicon nitride layer.

Then, a heavily doped impurity region is formed to contact the lightly doped impurity region and to be aligned with respect to the gate spacer, thereby obtaining an LDD structured source/drain. The heavily doped impurity region is an N+ impurity region when the semiconductor substrate is a p-type silicon substrate.

Next, the gate spacer formed along the sidewalls of the gate stacks is removed. After removal of the gate spacer, an interlevel dielectric layer, which fills a gap between the gate stacks but leaves a top surface of the etch stopper exposed, is formed. Then, a groove is formed on a gate conductive layer constituting the gate stack by etching, preferably isotropically, the exposed top surface of the etch stopper and the gate sacrificial mask. When forming the groove, it is preferable that the groove has a width greater than that of the gate stack, and that the gate conductive layer remains covered by a portion of the gate sacrificial mask.

Subsequently, a contact mask pattern that fills the groove is formed. After forming the contact mask pattern, a contact hole is formed to be self-aligned with respect to the contact mask pattern by etching the interlevel dielectric layer. The contact mask pattern may be formed from a silicon nitride layer and the interlevel dielectric layer may be formed of a silicon oxide layer. Thereafter, a contact pad is formed in the contact hole. The remaining aspects of the manufacture of the DRAM semiconductor device according to the first embodiment of the present invention are similar to those of a convention DRAM semiconductor device. Accordingly, a detailed description thereof will be omitted.

Prior to forming the gate stacks, channel stop impurities may be ion-implanted into the entire semiconductor substrate. If the semiconductor substrate is a p-type silicon substrate, boron is used as the channel stop impurities. After forming the groove on the gate conductive layer, it may be enlarged by isotropically etching the interlevel dielectric layer.

To provide the above-mentioned and other features of the present invention, there is also provided a method of fabricating a DRAM semiconductor device as a second embodiment of the present invention. In the method according to the second embodiment, a non-active region and an active region are defined on a semiconductor substrate, which is defined as a cell region and a core/peripheral circuit region. Then, gate stacks, in which a gate pattern and a gate sacrificial mask are sequentially deposited, are formed on the semiconductor substrate defined by a non-active region and an active region. The gate sacrificial mask may be formed from a silicon nitride layer.

Subsequently, an etch stopper is formed on the entire semiconductor substrate to surround the gate stacks. The etch stopper may be formed of a silicon nitride layer. Then, lightly doped impurity regions are formed between the gate stacks on the cell region and core/peripheral circuit region of the semiconductor substrate. The lightly doped impurity regions are N– impurity regions when the semiconductor substrate is a p-type silicon substrate, and may be individually formed in the cell region and the core/peripheral circuit region.

Next, a gate spacer is formed along sidewalls of the gate stacks on the cell region and core/peripheral circuit region.

The gate spacer may be formed from a silicon oxide layer, and may be etched to be thinner after forming the gate spacer of the cell region and the core/peripheral circuit region.

After forming the gate spacer, heavily doped impurity regions that contact the lightly doped impurity region, are formed on the cell region and core/peripheral circuit region and are aligned with respect to the gate spacer, thereby obtaining an LDD structured source/drain. The heavily doped impurity regions are individually formed in the cell region and core/peripheral circuit region, and may be N+ impurity regions if the semiconductor substrate is a p-type silicon substrate.

Then, the gate spacer formed along the sidewalls of the gate stacks is removed. An interlevel dielectric layer is formed to fill a gap between the gate stacks, but leaving a top surface of the etch stopper exposed. Thereafter, a groove is formed on a gate conductive layer constituting the gate stack by etching the exposed top surface of the etch stopper and the gate sacrificial mask. Preferably, the etch is an isotropic etch. When forming the groove, it is preferable that the width of the groove is greater than that of the gate stack, and that the gate conductive layer remains covered by a portion of the gate sacrificial mask.

Next, a contact mask pattern is formed to fill the groove. The contact mask may be formed from a silicon nitride layer. The interlevel dielectric layer may be formed of a silicon oxide layer. Then, a contact hole is formed to be self-aligned with respect to the contact mask pattern by etching the interlevel dielectric layer, and a contact pad is formed in the contact hole. The remaining aspects of the manufacture of the DRAM semiconductor device according to the second embodiment of the present invention are similar to those of a convention DRAM semiconductor device. Accordingly, a detailed description thereof will be omitted.

These and other features and advantages of the present invention will be readily apparent to those of ordinary skill in the art upon review of the detailed description that follows.

BRIEF DESCRIPTION OF THE DRAWINGS

The above features and advantages of the present invention will become apparent by describing in detail preferred embodiments thereof with reference to the attached drawings in which.

DETAILED DESCRIPTION OF THE INVENTION

Figure 1:
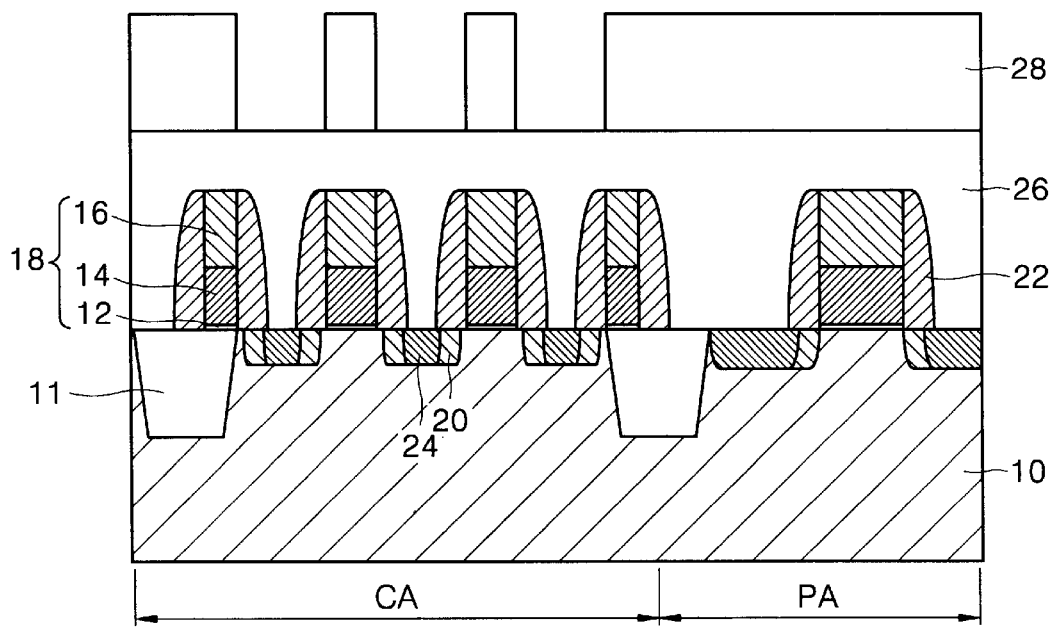
FIGS. 1 through 3 illustrate cross-sectional views for explaining a conventional method of fabricating a DRAM semiconductor device.
Figure 2:
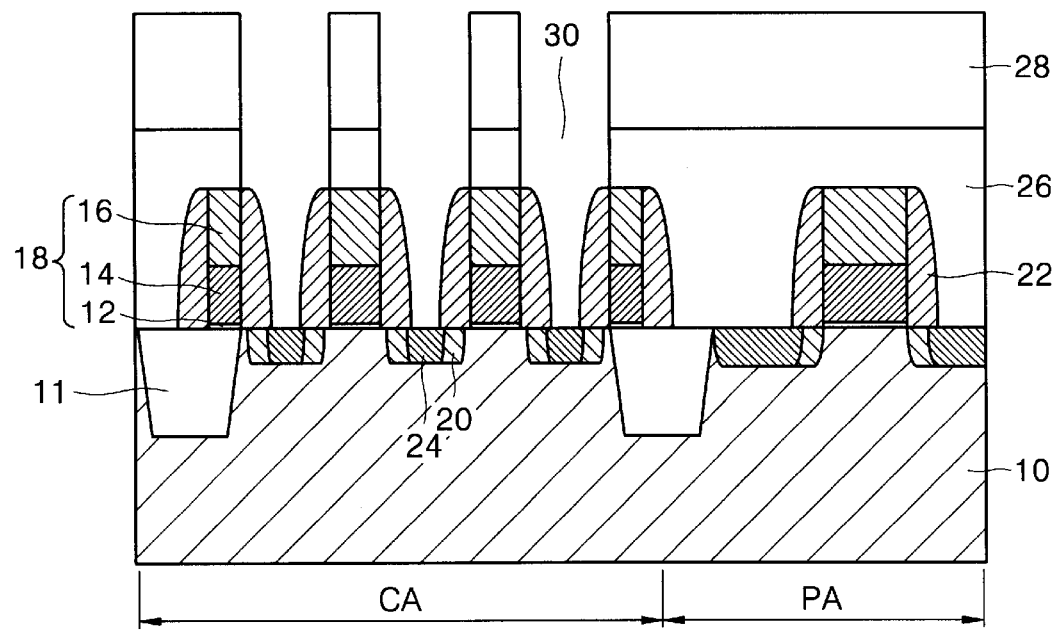
Figure 3:
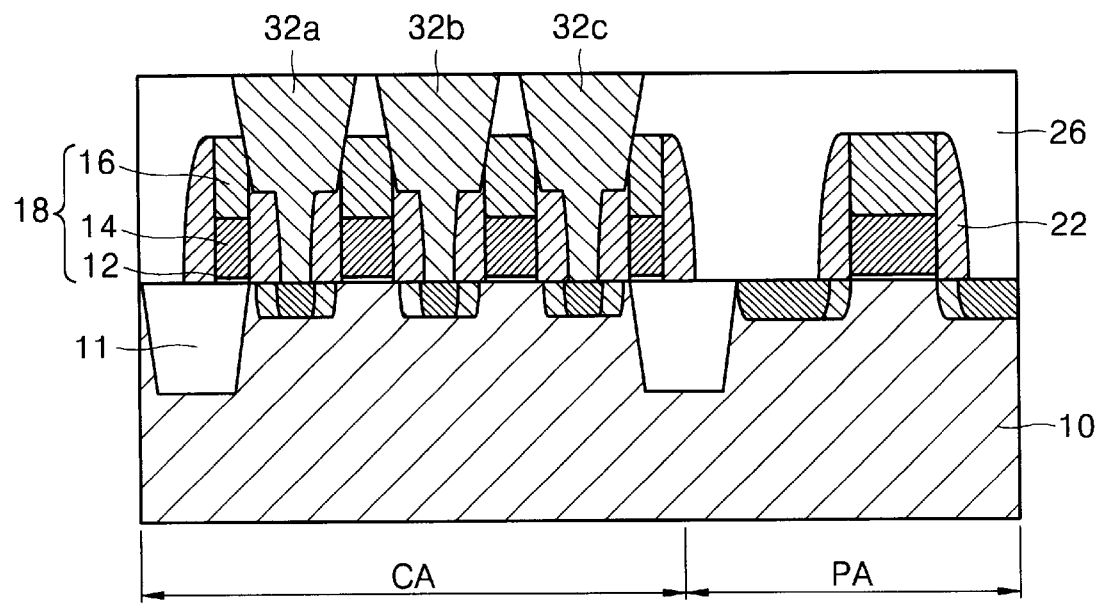
Figure 4:
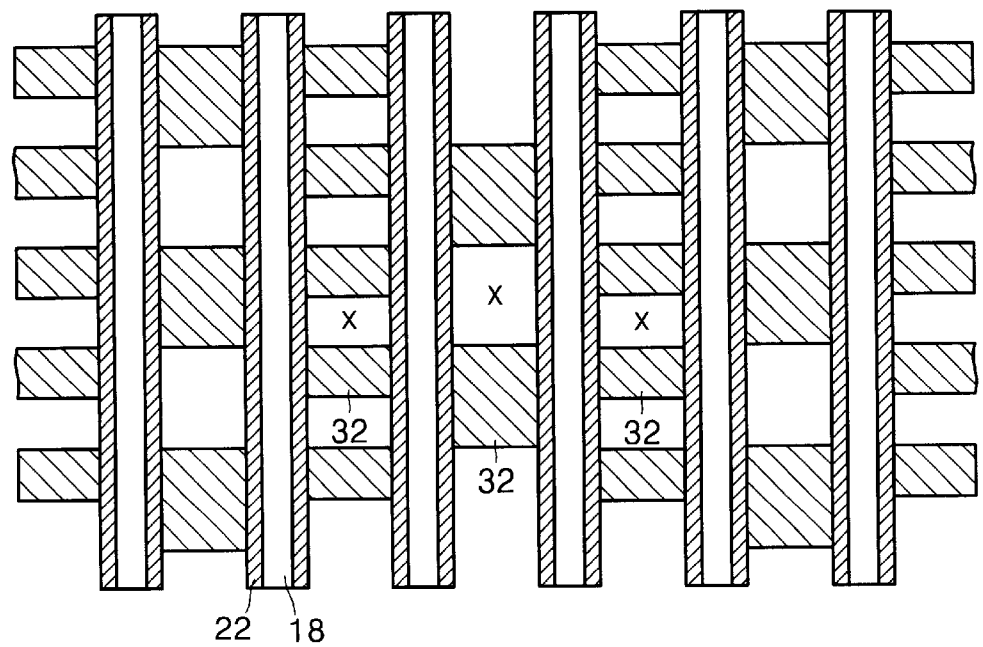
FIG. 4 shows a layout of the conventional DRAM semiconductor device shown in FIG. 3.

Korean Patent Application No. 01-46974, filed Aug. 3, 2001, and entitled: "Method of Fabricating DRAM Semiconductor Device," is incorporated by reference herein in its entirety.

The present invention will now be described more fully with reference to the accompanying drawings, in which preferred embodiments of the present invention are shown. The present invention may, however, be embodied in many different forms and should not be construed as being limited to the embodiments set forth herein; rather, these embodiments are provided so that this disclosure will be thorough and complete and will fully convey the concept of the present invention to those of ordinary skill in the art. In the drawings, the thickness of layers and regions are exaggerated for clarity. It will also be understood that when a layer is referred to as being "on" another layer or substrate, it may be directly on the other layer or substrate, or intervening layers may also be present. Like reference numerals represent like elements throughout the drawings.

FIGS. 5 through 15 show cross-sectional views of a DRAM semiconductor device for illustrating steps of a method of fabricating the same.

Figure 5:
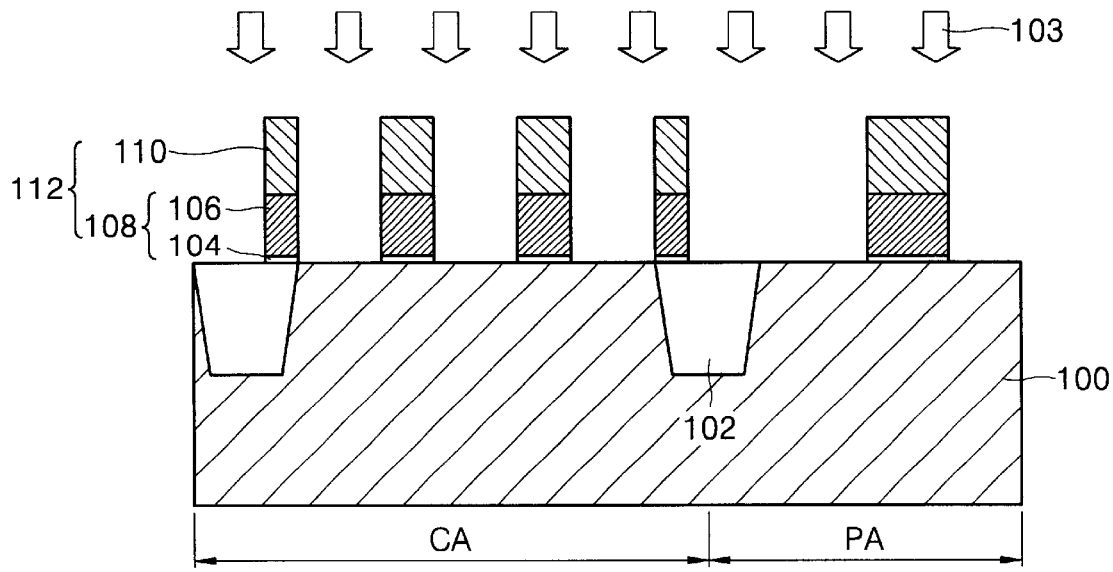
FIGS. 5 through 15 illustrate cross-sectional views of steps of a method of fabricating a DRAM semiconductor device according to the present invention.

Referring to FIG. 5, a shallow trench isolation (STI) region 102 is formed on a semiconductor substrate 100, e.g., a p-type silicon substrate. A region of the semiconductor substrate 100 on which the STI region 102 is formed is a non-active region and the other region is an active region. Alternately, the semiconductor substrate 100 may also be defined by a cell array (CA) region, in which memory cells are formed, and a core/peripheral circuit (PA) region.

Subsequently, channel stop impurities 103 may be ion-implanted into the semiconductor substrate 100 having the STI region 102 to control a threshold voltage of a transistor. The distance between gate stacks, i.e. the channel length, is broader as compared to the distance in a conventional DRAM semiconductor device because an interlevel dielectric layer is deposited after the removal of a gate spacer during a subsequent process. Accordingly, the threshold voltage of a transistor may be controlled with a minimum dose of channel stop impurities 103. If the semiconductor substrate 100 is a p-type silicon substrate, boron is used as the channel stop impurity 103.

Next, a gate stack 112 is formed on the semiconductor substrate 100. The gate stack 112 includes a gate pattern 108 and a gate sacrificial mask 110. The gate pattern 108 may include a gate dielectric layer 104 and a gate conductive layer 106. Preferably, the gate dielectric layer 104, the gate conductive layer 106 and the gate sacrificial mask 110 are formed of a silicon oxide layer, a double layer of a polysilicon layer and a metal silicide, and a silicon nitride layer, respectively. The width of the gate pattern 108 is preferably formed to be different in the CA region and the PA region.

Figure 6:
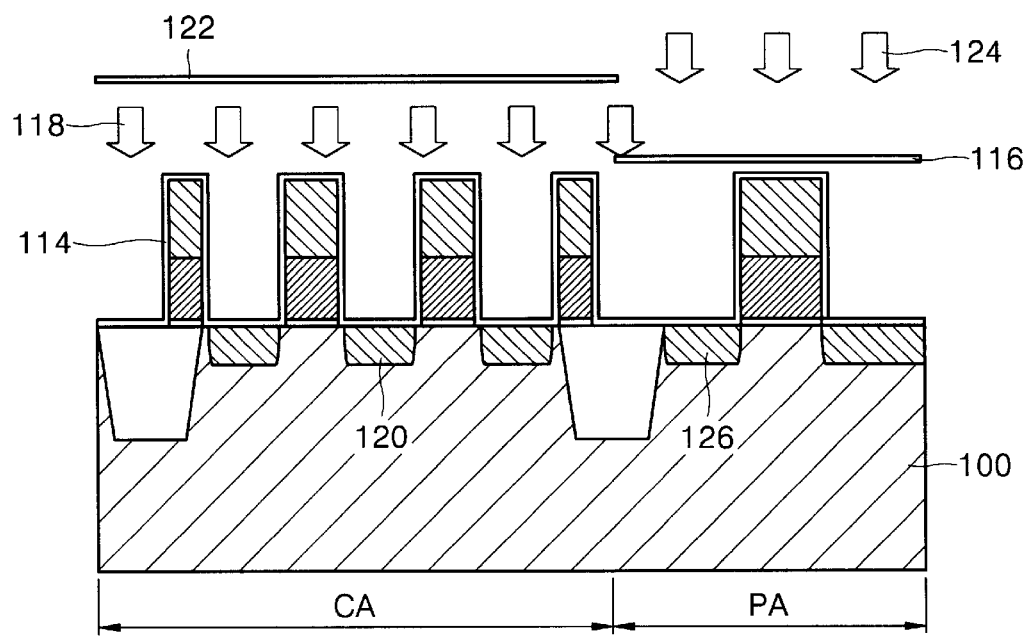

Referring to FIG. 6, an etch stopper 114 is formed on the entire semiconductor substrate 100 having the gate stack 112 of FIG. 5 to surround the gate stack 112. The etch stopper 114 is preferably formed of a silicon nitride layer.

A first lightly doped impurity region 120 is formed, preferably by forming a first photoresist mask 116 on the PA and implanting impurities 118 in the CA region. The first lightly doped impurity region 120 on the CA may be formed of phosphorous or arsenic (preferably, phosphorous) when the semiconductor substrate 100 is a p-type silicon substrate. In this case, the first lightly doped impurity region 120 becomes an N− impurity region.

Then, a second lightly doped impurity region 126 is preferably formed in the PA by removing the first photoresist mask 116 from the PA, forming a second photoresist mask 122 on the CA and implanting impurities 124 in the PA region. If the semiconductor substrate 100 is a p-type silicon substrate, then the second lightly doped impurity region 126 on the PA becomes an N− impurity region or a P− impurity region by using phosphorous (or arsenic) or boron as the impurities, respectively.

Figure 7:
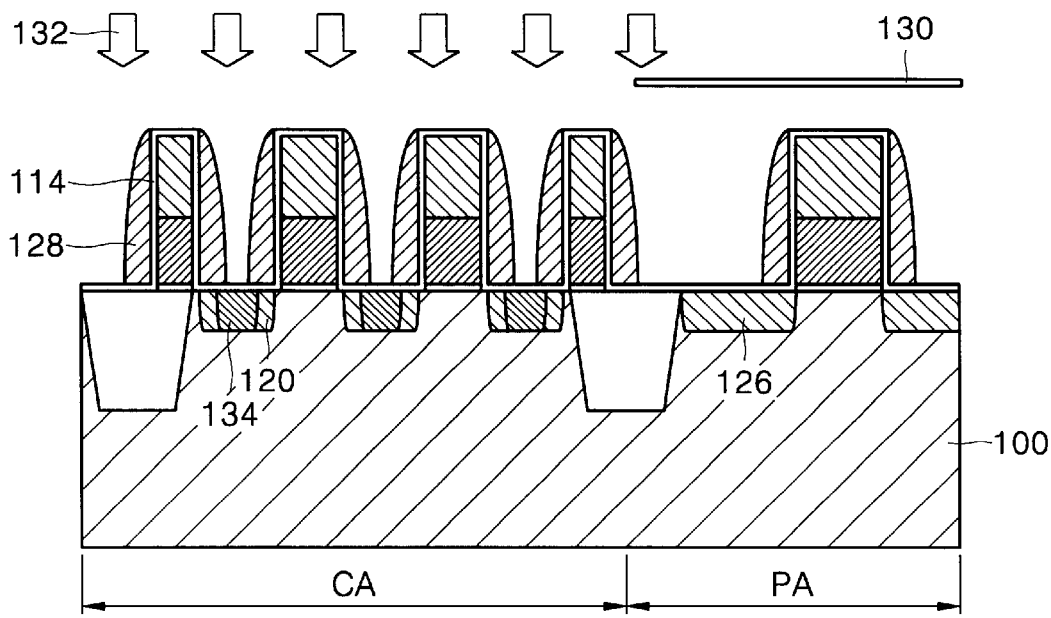

Referring to FIG. 7, the second photoresist mask 122 is removed and a gate spacer 128 is formed along sidewalls of the gate stack 112. Preferably, the gate spacer 128 is formed from a silicon oxide layer. For instance, the gate spacer 128 may be obtained by forming a silicon oxide layer on the entire semiconductor substrate 100 having the gate stack 112 and the etch stopper 114, and anisotropically etching the silicon oxide layer using an etching selectivity with respect to the etch stopper 114. By anisotropically etching the silicon oxide layer, the etch stopper 114 may prevent damage to the surface of the semiconductor substrate 100 of the CA on which a source/drain is to be formed. The threshold voltage and saturated drain current value of a transistor are determined by the thickness of the gate spacer 128.

Next, a third photoresist mask 130 may be formed on the PA and a heavily doped impurity region 134 is then formed adjacent to the lightly doped impurity region 120 and aligned with respect to the gate spacer 128. Preferably, the heavily doped impurity region 134 is obtained by implanting additional impurities 132 in the lightly doped impurity region 120 in the CA, so that the heavily doped impurity region has a higher impurity concentration than the lightly doped impurity region 120. When the semiconductor substrate 100 is a p-type silicon substrate, if the impurities 132 implanted into the heavily doped impurity region 134 are formed of arsenic or phosphorous (preferably, arsenic), the heavily doped impurity region 134 becomes an N+ impurity region having a greater impurity concentration than an N− impurity region. Eventually, an LDD-structured source/drain composed of the lightly doped impurity region 120 and the heavily doped impurity region 134 is formed on the CA.

Figure 8:
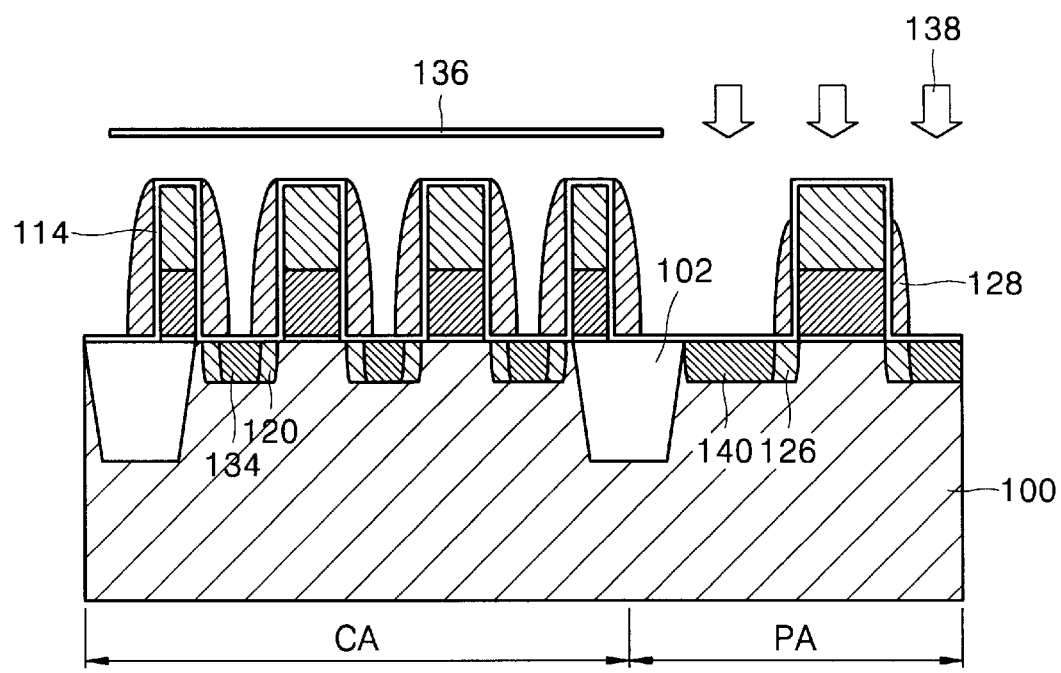

Referring to FIG. 8, a heavily doped impurity region 140 is formed adjacent to the lightly doped impurity region 126, preferably by removing the third photoresist mask 130 of FIG. 7 and forming a fourth photoresist mask 136 on the CA. Then, the gate spacer 128 on the PA may be isotropically etched to reduce a thickness thereof. During the isotropical etching of the gate spacer 128, the etch stopper 114 prevents any damage of the STI region 102 or the semiconductor substrate 100. Preferably, the thickness of the gate spacer 128 on the PA is reduced because the gate length of the PA is larger than that of the CA, thereby reducing short channel effects. Further, a reduction in the thickness of the gate spacer 128 results in an increase in the saturated drain current value, thereby enhancing the transistor characteristics.

Thereafter, impurities 138 are preferably implanted into the PA using the fourth photoresist mask 136 as a mask so that the heavily doped impurity region 140 has a greater impurity concentration than the lightly doped impurity region 126. When the semiconductor substrate 100 is a p-type silicon substrate, the heavily doped impurity region 140 may be formed of arsenic (or phosphorous) to become an N+ impurity region or boron to become a P+ impurity region, which has a greater impurity concentration than an N− impurity region or a P− impurity region, respectively. As a result, an LDD structured source/drain made of the lightly doped impurity region 126 and the heavily doped impurity region 140, is formed on the PA.

Figure 9:
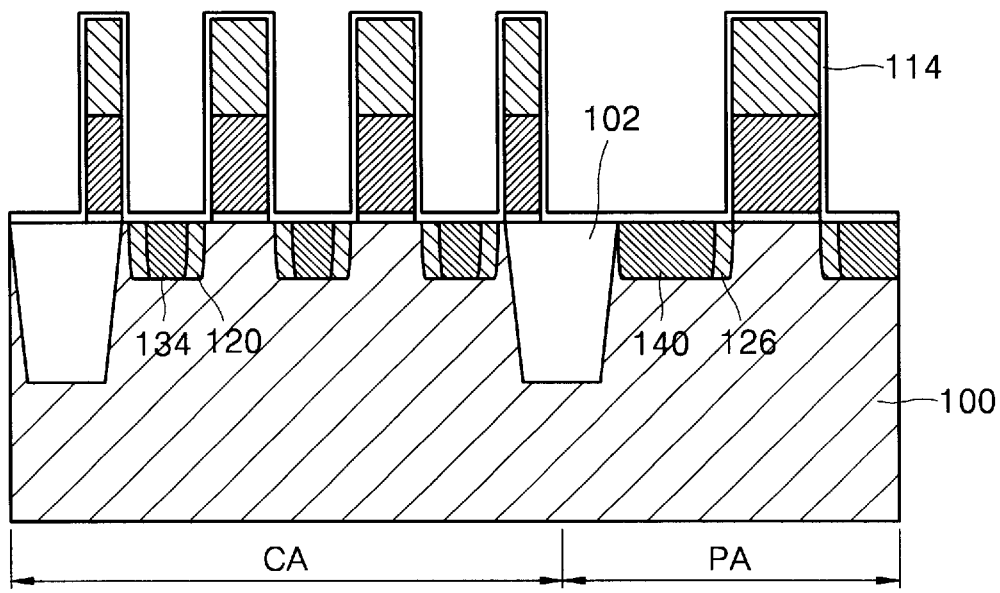

Referring now to FIG. 9, the fourth photoresist mask 136 of FIG. 8 is removed. The gate spacer 128 of FIG. 8, formed along with the sidewalls of the gate stack 112 of FIG. 5, is completely removed, preferably by isotropic etching. By isotropically etching the gate spacer 128, the etch stopper 114 prevents any damage to the STI region 102 or the surface of the semiconductor substrate. The removal of the gate spacer 128 causes the distance between the gate stacks 112 to increase, so that a first interlevel dielectric layer 142, shown in FIG. 10, may completely fill a gap between the gate stacks 112 without the formation of a void during a subsequent process. Also, if a distance between the gate stacks 112, i.e., a channel length, is increased, a dose of the channel stop impurities 103 of FIG. 5, which is used for controlling a threshold voltage, may be reduced or minimized.

Figure 10:
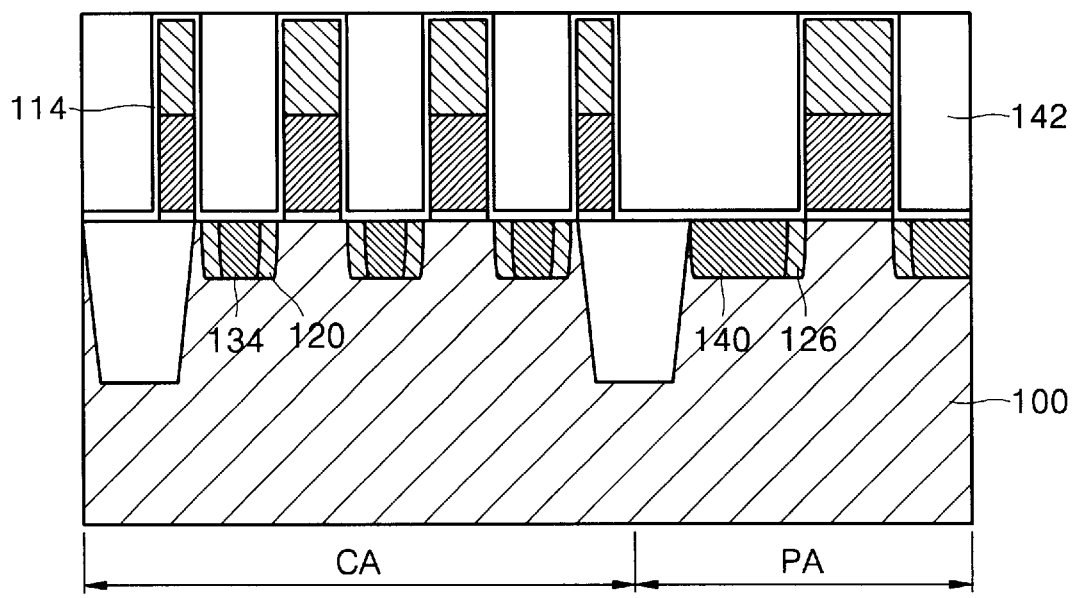

Referring to FIG. 10, the first interlevel dielectric layer 142 is formed to fill a gap between the gate stacks 112 of FIG. 5. The first interlevel dielectric layer 142 is preferably formed of a silicon oxide layer. As described above, because the first interlevel dielectric layer 142 is formed after the removal of the gate spacer 128 of FIG. 8, a gap between the gate stacks 112 may be completely filled without voids. The first interlevel dielectric layer 142 is preferably made by forming a silicon oxide layer on the entire semiconductor substrate 100 to fill a gap between the gate stacks 112 and planarizing the silicon oxide layer with the etch stopper 114 formed on the gate stack 112 as an etch stopping point. The planarization is preferably performed by a chemical-mechanical polishing (CMP). Finally, the surface of the etch stopper 114 is exposed on the gate stack 112.

Figure 11:
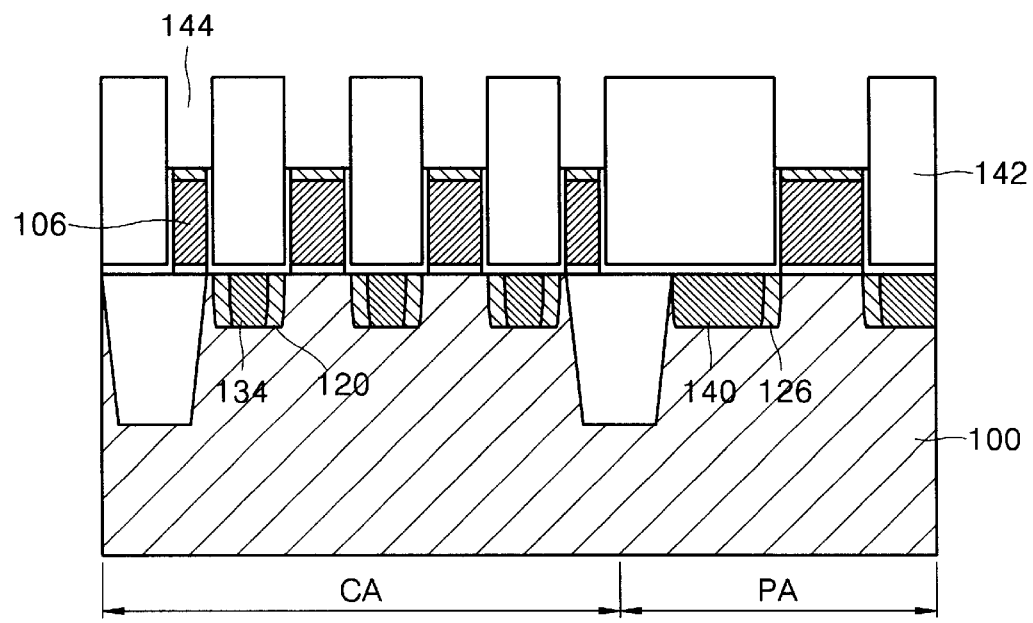

Referring to FIG. 11, the exposed etch stopper 114 of FIG. 10 and the gate sacrificial mask 110 of FIG. 5 are etched, preferably by isotropic etching, to a level at which the gate conductive layer 106 remains covered by a portion of the gate sacrificial mask 110, thereby forming a groove 144 on the gate conductive layer 106. Preferably, the groove 144 has a greater width than the gate stack 112. A phosphoric acid solution is preferably used when the etch stopper 114 and the gate sacrificial mask 110 are isotropically etched. By using the phosphoric acid solution, the etch stopper 114 and the gate sacrificial mask 110, which are preferably formed of a silicon nitride layer, may be etched without damage to the first interlevel dielectric layer 142 formed preferably of a silicon oxide layer.

Figure 12:
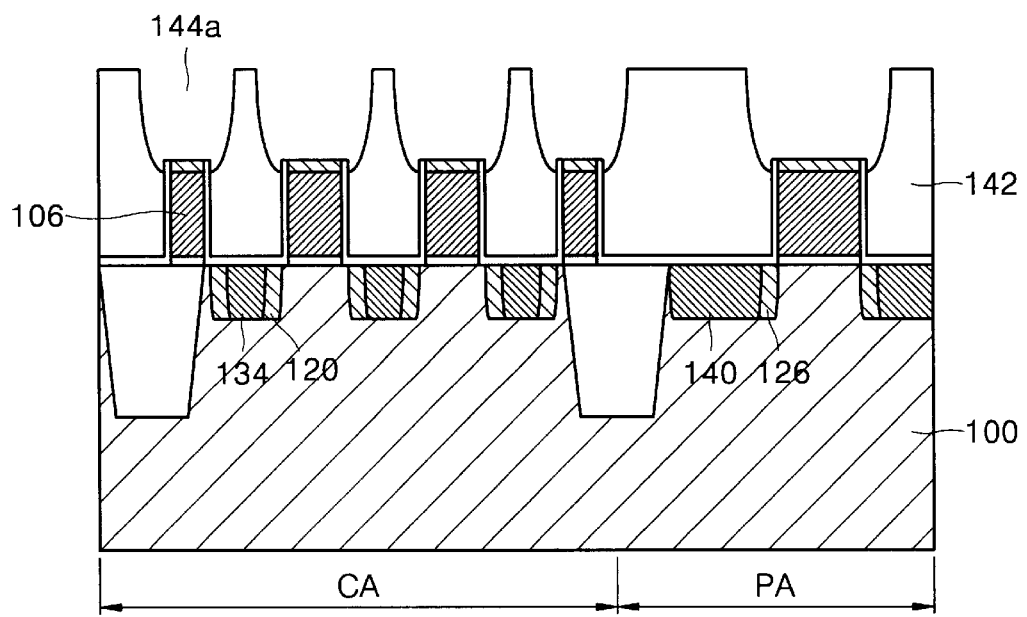

Referring to FIG. 12, the first interlevel dielectric layer 142 adjacent the groove 144 of FIG. 11 on the gate conductive layer 106, is preferably isotropically etched to be broadened, thereby obtaining an enlarged groove 144a. The isotropic etch may be performed with a fluoric acid solution. When forming the enlarged groove 144a, the amount by which the first interlevel dielectric layer 142 is etched may be determined by considering the resistance of a source/drain contact and the distance between the source/drain contact and a gate pattern.

Figure 13:
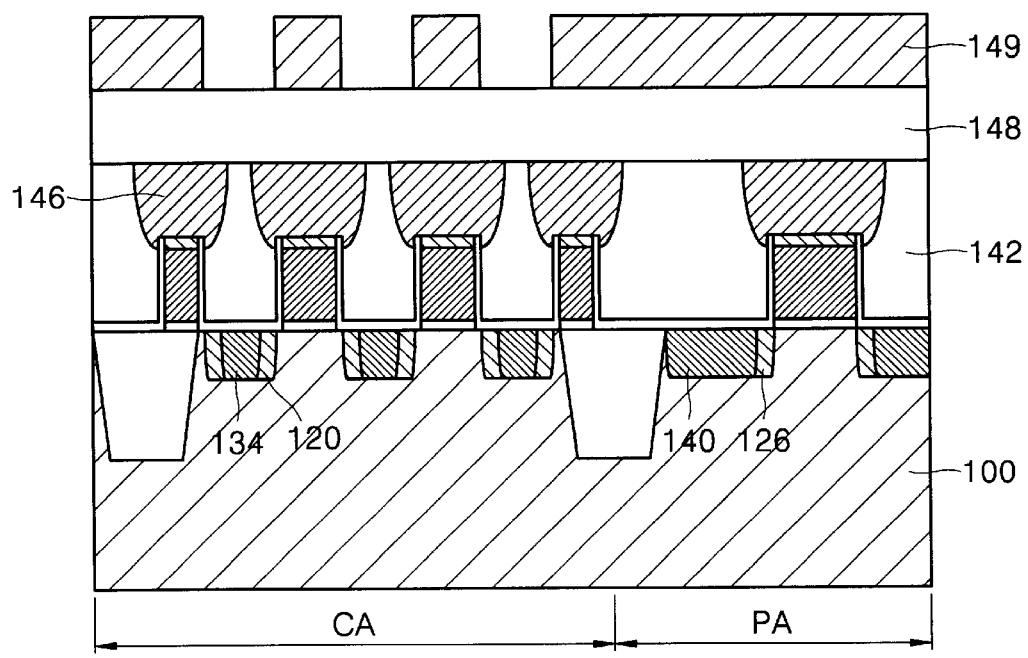

Referring to FIG. 13, a contact mask pattern 146 is formed to fill the enlarged groove 144a of FIG. 12, or the groove prior to enlargement. The contact mask pattern 146 may be formed from a silicon nitride layer, and may be obtained by forming a silicon nitride layer on the entire semiconductor substrate 100 to fill the enlarged groove 144a, and then, planarizing the silicon nitride layer by CMP until the surface of the first interlevel dielectric layer 142 is exposed. Thereafter, a second interlevel dielectric layer 148 may be formed on the entire semiconductor substrate 100 having the contact mask pattern 146. Then, a photoresist pattern 149 may be formed on the second interlevel dielectric layer 148.

Figure 14:
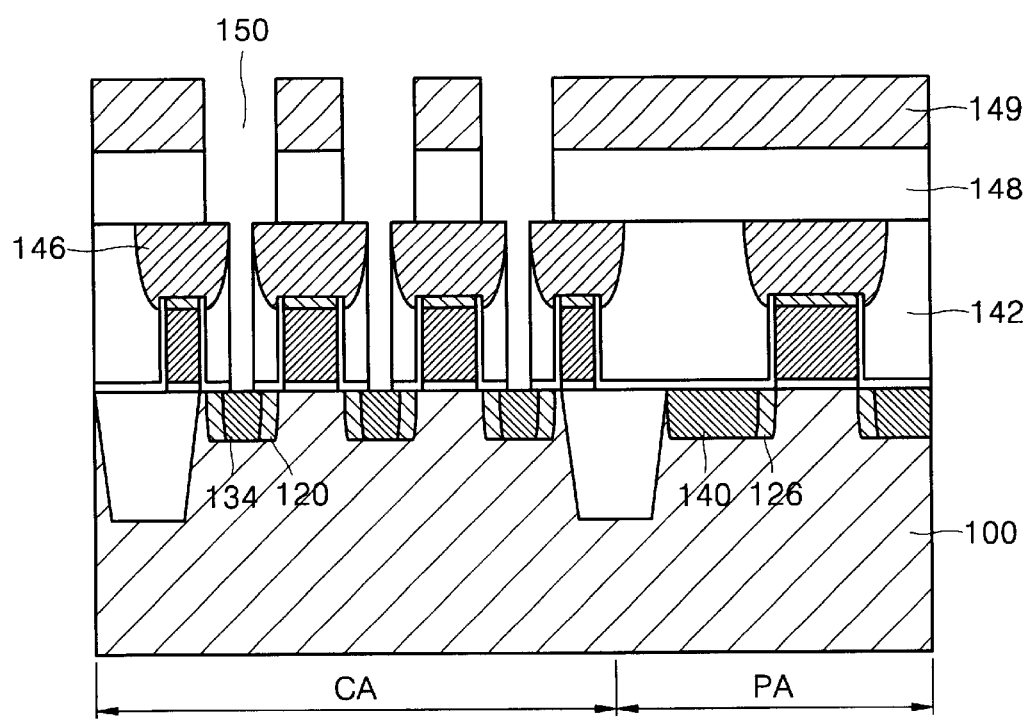

Referring to FIG. 14, the first interlevel dielectric layer 142 and the second interlevel dielectric layer 148 are etched to form contact holes 150, which expose the heavily doped impurity regions 134 on the CA. As a result, the first and second interlevel dielectric layers 142 and 148 are self-aligned with respect to the contact mask pattern 146.

Figure 15:
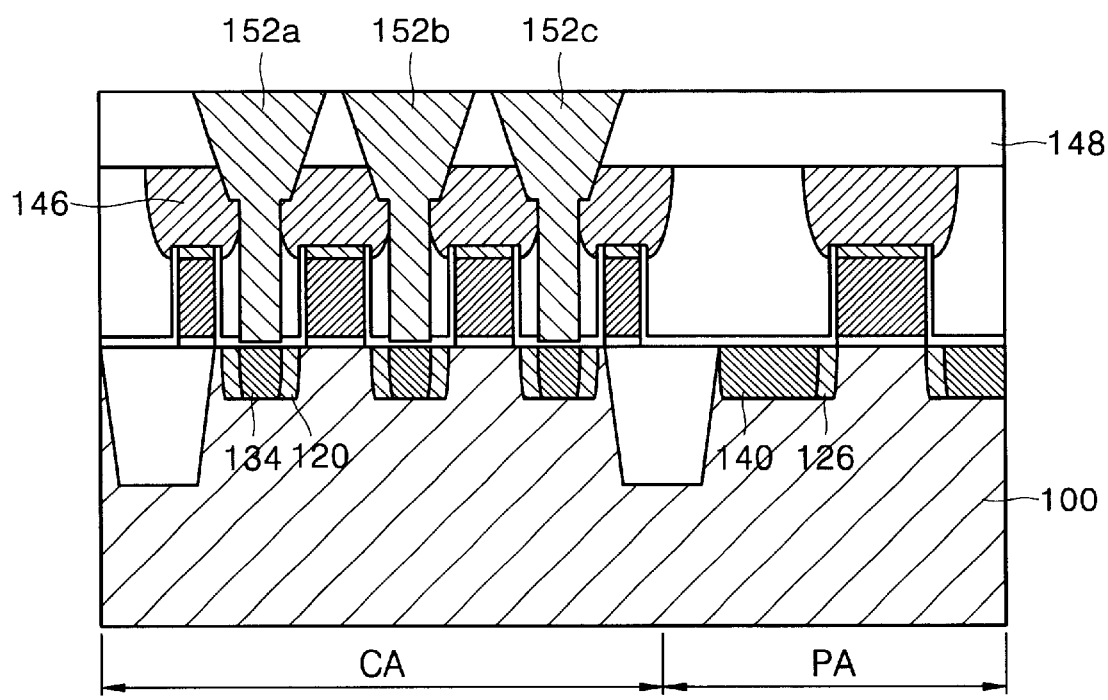

Referring to FIG. 15, contact pads 152a through 152c, which fill the contact holes 150, are formed on the heavily doped impurity regions 134. During a subsequent process, contact pad 152b, and contact pads 152a and 152c will become a direct contact (DC) pad connected to a bit line and buried contact (BC) pads connected to a storage electrode, respectively. The remaining aspects of the manufacture of the DRAM semiconductor device according to the present invention are similar to those of a convention DRAM semiconductor device. Accordingly, a detailed description thereof will be omitted.

As described above, in a method of fabricating a DRAM semiconductor device according to the present invention, the distance between gate stacks, i.e., a channel length, is greater than that in a semiconductor device made by a conventional method because an interlevel dielectric layer is deposited after the removal of a gate spacer. Accordingly, it is possible to make a semiconductor device having an LDD structure, and further, to control a threshold voltage of a transistor with a reduced or minimal dose of channel stop impurities.

Moreover, in the method of fabricating a DRAM semiconductor device according to the present invention, a contact pad may be easily formed by a SAC method using a contact mask pattern as an etching mask.

Preferred embodiments of the present invention have been disclosed herein and, although specific terms are employed, they are used and are to be interpreted in a generic and descriptive sense only and not for purposes of limitation. Accordingly, it will be understood by those of ordinary skill in the art that various changes in form and details may be made without departing from the spirit and scope of the present invention as set forth in the following claims.

What is claimed is:

1. A method of fabricating a DRAM semiconductor device comprising:
    forming gate stacks in which a gate pattern and a gate sacrificial mask are sequentially deposited on a semiconductor substrate defined by a non-active region and an active region;
    forming an etch stopper on the entire semiconductor substrate to surround the gate stacks;
    forming a lightly doped impurity region between the gate stacks on the semiconductor substrate;
    forming a gate spacer along sidewalls of the gate stacks;
    forming a heavily doped impurity region to contact the lightly doped impurity region and to be aligned with respect to the gate spacer, thereby obtaining an LDD structured source/drain;
    removing the gate spacer formed along the sidewalls of the gate stacks;
    forming an interlevel dielectric layer which fills a gap between the gate stacks but leaves a top surface of the etch stopper exposed;
    forming a groove on a gate conductive layer constituting the gate stack by etching the exposed top surface of the etch stopper and the gate sacrificial mask;
    forming a contact mask pattern for filling the groove;
    forming a contact hole to be self-aligned with respect to the contact mask pattern by etching the interlevel dielectric layer; and
    forming a contact pad in the contact hole.

2. The method as claimed in claim 1, wherein channel stop impurities are ion-implanted into the entire semiconductor substrate before forming the gate stacks.

3. The method as claimed in claim 2, wherein boron is used as the channel stop impurity when the semiconductor substrate is a p-type silicon substrate.

4. The method as claimed in claim 1, wherein the gate sacrificial mask, the etch stopper and the contact mask pattern are formed from a silicon nitride layer and the interlevel dielectric layer is formed of a silicon oxide layer.

5. The method as claimed in claim 1, wherein the lightly doped impurity region is formed of a dopant selected from the group consisting of phosphorous and arsenic when the semiconductor substrate is a p-type silicon substrate.

6. The method as claimed in claim 1, wherein the lightly doped impurity region is an N– impurity region when the semiconductor substrate is a p-type silicon substrate.

7. The method as claimed in claim 1, wherein the gate spacer is formed from a silicon oxide layer.

8. The method as claimed in claim 1, wherein the heavily doped impurity region is formed of a dopant selected from the group consisting of phosphorous and arsenic when the semiconductor substrate is a p-type silicon substrate.

9. The method as claimed in claim 1, wherein the heavily doped impurity region is an N+ impurity region when the semiconductor substrate is a p-type silicon substrate.

10. The method as claimed in claim 1, wherein the groove formed on the gate conductive layer is obtained by isotropically etching the etch stopper and the gate sacrificial mask.

11. The method as claimed in claim 1, wherein the groove formed on the gate conductive layer has a greater width than the gate stack.

12. The method as claimed in claim 1, wherein the gate conductive layer remains covered by a portion of the gate sacrificial mask when the groove is formed on the gate conductive layer.

13. The method as claimed in claim 1, wherein the interlevel dielectric layer is isotropically etched to enlarge the groove after forming the groove on the gate conductive layer.

14. A method of fabricating a DRAM semiconductor device comprising:

defining a non-active region and an active region on a semiconductor substrate which is defined as a cell region and a core/peripheral circuit region;

forming gate stacks in which a gate pattern and a gate sacrificial mask are sequentially deposited on the semiconductor substrate defined by a non-active region and an active region;

forming an etch stopper on the entire semiconductor substrate to surround the gate stacks;

forming lightly doped impurity regions between the gate stacks on the cell region and core/peripheral circuit region of the semiconductor substrate;

forming a gate spacer along sidewalls of the gate stacks on the cell region and core/peripheral circuit region;

forming heavily doped impurity regions which contact the lightly doped impurity regions on the cell region and core/peripheral circuit region and are aligned with respect to the gate spacer, thereby obtaining an LDD structured source/drain;

removing the gate spacer formed along the sidewalls of the gate stacks;

forming an interlevel dielectric layer which fills a gap between the gate stacks but leaves a top surface of the etch stopper exposed;

forming a groove on a gate conductive layer constituting the gate stack by etching the exposed top surface of the etch stopper and the gate sacrificial mask;

forming a contact mask pattern for filling the groove;

forming a contact hole to be self-aligned with respect to the contact mask pattern by etching the interlevel dielectric layer; and forming a contact pad in the contact hole.

15. The method as claimed in claim 12 further comprising ion implanting channel stop impurities into the entire semiconductor substrate before forming the gate stacks.

16. The method as claimed in claim 12, wherein boron is used as the channel stop impurity when the semiconductor substrate is a p-type silicon substrate.

17. The method as claimed in claim 12, wherein the gate sacrificial mask, the etch stopper and the contact mask are formed of a silicon nitride layer and the interlevel dielectric layer is formed of a silicon oxide layer.

18. The method as claimed in claim 12, wherein the lightly doped impurity regions are individually formed in the cell region and the core/peripheral circuit region.

19. The method as claimed in claim 12, wherein the lightly doped impurity region on the cell region is formed of a dopant selected from the group consisting of phosphorous and arsenic when the semiconductor substrate is a p-type silicon substrate.

20. The method as claimed in claim 12, wherein the lightly doped impurity region on the cell region is an N– impurity region when the semiconductor substrate is a p-type silicon substrate.

21. The method as claimed in claim 12, wherein the gate spacer is formed from a silicon oxide layer.

22. The method as claimed in claim 12, wherein the gate spacer on the core/peripheral circuit region is etched to be thinner after forming the gate spacer on the cell region and the core/peripheral circuit region.

23. The method as claimed in claim 12, wherein the heavily doped impurity regions are individually formed in the cell region and core/peripheral circuit region.

24. The method as claimed in claim 12, wherein the heavily doped impurity region on the cell region is formed of a dopant selected from the group consisting of phosphorous and arsenic when the semiconductor substrate is a p-type silicon substrate.

25. The method as claimed in claim 12, wherein the heavily doped impurity region on the cell region is an N+ impurity region when the semiconductor substrate is a p-type silicon substrate.

26. The method as claimed in claim 12, wherein the groove formed on the gate conductive layer has a larger width than the gate conductive stack.

27. The method as claimed in claim 12, wherein the gate conductive layer remains covered by a portion of the gate sacrificial mask when the groove is formed on the gate conductive layer.

28. The method as claimed in claim 12, wherein the groove on the gate conductive layer is obtained by isotropically etching the etch stopper and the gate sacrificial mask.

29. The method as claimed in claim 12, wherein the interlevel dielectric layer is isotropically etched to enlarge the groove after forming the groove on the gate conductive layer.

* * * * *